(12) United States Patent
Bonanno et al.

(10) Patent No.: US 8,898,426 B2
(45) Date of Patent: Nov. 25, 2014

(54) TARGET BUFFER ADDRESS REGION TRACKING

(75) Inventors: James J. Bonanno, Wapperingers Falls, NY (US); Brian R. Prasky, Wappingers Falls, NY (US); Aaron Tsai, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 13/492,943

(22) Filed: Jun. 11, 2012

(65) Prior Publication Data
US 2013/0332699 A1    Dec. 12, 2013

(51) Int. Cl.
*G06F 12/02* (2006.01)
*G06F 9/38* (2006.01)
*G11C 29/00* (2006.01)

(52) U.S. Cl.
CPC ............. *G06F 12/02* (2013.01); *G11C 29/76* (2013.01); *G06F 9/3806* (2013.01)
USPC .......................................... 711/204; 711/203

(58) Field of Classification Search
CPC ........ G06F 9/3806; G06F 12/02; G11C 29/76
USPC .................................................. 711/204, 203
See application file for complete search history.

(56) References Cited

U.S. PATENT DOCUMENTS

| | | | |
|---|---|---|---|
| 5,978,909 A | 11/1999 | Lempel | |
| 6,119,221 A * | 9/2000 | Zaiki et al. | 712/237 |
| 6,622,241 B1 | 9/2003 | Brockmann et al. | |
| 7,124,287 B2 | 10/2006 | Prasky et al. | |
| 7,404,070 B1 | 7/2008 | Patil et al. | |
| 7,471,574 B2 | 12/2008 | Park | |
| 7,676,663 B2 | 3/2010 | Prasky et al. | |
| 7,849,298 B2 * | 12/2010 | Arimilli et al. | 712/228 |
| 7,873,818 B2 | 1/2011 | Bonanno et al. | |
| 7,873,819 B2 | 1/2011 | Moyer et al. | |
| 7,949,862 B2 | 5/2011 | Yokoi et al. | |
| 8,019,980 B2 | 9/2011 | Wang | |
| 2006/0004949 A1 * | 1/2006 | Van Steenwijk et al. | 711/103 |
| 2009/0313462 A1 | 12/2009 | Emma et al. | |
| 2011/0093658 A1 | 4/2011 | Zuraski, Jr. et al. | |

OTHER PUBLICATIONS

Perleberg, et al., Branch Target Buffer Design and Optimization, IEEE Transactions on Computers, vol. 42, No. 4, Apr. 1993, pp. 396-412.
Sadeghi et al., Power-Aware Branch Target Prediction Using a New BTB Architecture, VLSI-SoC 17th IFIP International Conference on Oct. 12-14, 2009, pp. 53-58.

* cited by examiner

*Primary Examiner* — Hashem Farrokh
(74) *Attorney, Agent, or Firm* — Cantor Colburn LLP; Margaret McNamara

(57) ABSTRACT

Embodiments relate to target buffer address region tracking. An aspect includes receiving a restart address, and comparing, by a processing circuit, the restart address to a first stored address and to a second stored address. The processing circuit determines which of the first and second stored addresses is identified as a same range and a different range to form a predicted target address range defining an address region associated with an entry in the target buffer. Based on determining that the restart address matches the first stored address, the first stored address is identified as the same range and the second stored address is identified as the different range. Based on determining that the restart address matches the second stored address, the first stored address is identified as the different range and the second stored address is identified as the same range.

8 Claims, 8 Drawing Sheets

TARGET BUFFER ADDRESS REGION TRACKING

BACKGROUND

The present invention relates generally to computer processing systems, and more specifically, to target buffer address region tracking.

An instruction pipeline in a computer processor improves instruction execution throughput by processing instructions using a number of pipeline stages, where multiple stages can act on different instructions of an instruction stream in parallel. A conditional branch instruction in an instruction stream may result in a pipeline stall if the processor waits until the conditional branch instruction is resolved in an execution stage in the pipeline before fetching a next instruction in an instruction fetching stage for the pipeline. A branch predictor may attempt to guess whether a conditional branch will be taken or not. Branch target prediction attempts to guess a target of a taken conditional or unconditional branch before it is computed by decoding and executing the instruction itself. A branch target may be a computed address based on an offset and/or an indirect reference through a register.

A branch target buffer (BTB) is used to predict the target of a predicted taken branch instruction based on the address of the branch instruction. Predicting the target of the branch instruction can prevent pipeline stalls by not waiting for the branch instruction to reach the execution stage of the pipeline to compute the branch target address. By performing branch target prediction, the branch's target instruction decode may be performed in the same cycle or the cycle after the branch instruction instead of having multiple bubble/empty cycles between the branch instruction and the target of the predicted taken branch instruction.

SUMMARY

Exemplary embodiments include a system for target buffer address region tracking. The system includes memory configured to store instructions accessible by a processor. The processor includes a target buffer, and the processor is configured to perform a method. The method includes receiving a restart address, and comparing the restart address to a first stored address and to a second stored address. The method also includes determining which of the first and second stored addresses is identified as a same range and a different range to form a predicted target address range defining an address region associated with an entry in the target buffer. Based on determining that the restart address matches the first stored address, the first stored address is identified as the same range and the second stored address is identified as the different range. Based on determining that the restart address matches the second stored address, the first stored address is identified as the different range and the second stored address is identified as the same range. Based on determining that the restart address matches neither the first stored address nor the second stored address, identification of the same range and the different range is swapped, and the restart address is written to one of the first and second stored addresses identified as the same range after the swapping. Swapping identification of the same range and the different range can also be performed based on determining that target address encoding identifies the different range.

Further exemplary embodiments include a computer-implemented method for target buffer address region tracking. The method includes receiving a restart address, and comparing, by a computer, the restart address to a first stored address and to a second stored address. The method further includes determining, by the computer, which of the first and second stored addresses is identified as a same range and a different range to form a predicted target address range defining an address region associated with an entry in a target buffer. Based on determining that the restart address matches the first stored address, the first stored address is identified as the same range and the second stored address is identified as the different range. Based on determining that the restart address matches the second stored address, the first stored address is identified as the different range and the second stored address is identified as the same range. Based on determining that the restart address matches neither the first stored address nor the second stored address, identification of the same range and the different range is swapped, and the restart address is written to one of the first and second stored addresses identified as the same range after the swapping. Swapping identification of the same range and the different range can also be performed based on determining that target address encoding identifies the different range.

Additional exemplary embodiments include a computer program product for target buffer address region tracking. The computer program product includes a tangible storage medium readable by a processing circuit including a target buffer and storing instructions for execution by the processing circuit for performing a method. The method includes receiving a restart address, and comparing, by the processing circuit, the restart address to a first stored address and to a second stored address. The method further includes determining, by the processing circuit, which of the first and second stored addresses is identified as a same range and a different range to form a predicted target address range defining an address region associated with an entry in the target buffer. Based on determining that the restart address matches the first stored address, the first stored address is identified as the same range and the second stored address is identified as the different range. Based on determining that the restart address matches the second stored address, the first stored address is identified as the different range and the second stored address is identified as the same range. Based on determining that the restart address matches neither the first stored address nor the second stored address, identification of the same range and the different range is swapped, and the restart address is written to one of the first and second stored addresses identified as the same range after the swapping. Swapping identification of the same range and the different range can also be performed based on determining that target address encoding identifies the different range.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

Exemplary embodiments provide branch target buffer (BTB) address region tracking. A BTB receives a search address, which is a function of a pipeline restart, a branch target, or a sequential BTB search, and uses a portion of the address as an index to access BTB entries for determining a branch target address, also referred to as a predicted target address. The search address may be the same as that of an instruction fetch (I-fetch) address if the BTB and I-fetch are synchronous with one another, or they may be different if they are asynchronous from one another and the BTB is running ahead of the I-fetch. For example, given a 64-bit address where the most significant bit is bit-0 (big endian), and a BTB that contains 1024 congruence classes, the BTB may be indexed with bits 50:59 while bits 32:49 & 60:63 of the search address serve as tag addresses. There may be a diminishing return, i.e., performance gain at the cost of chip area, power, and/or cycle time, for adding more tag bits (accuracy). Furthermore, for a target address, while all 64 bits could be kept for the target, going beyond a specified number of bits may use more area, power, and/or cycle time of a microprocessor than the performance value it returns in accuracy. For instance, predicted target address bits 32:63 of a branch target may be stored in the BTB while predicted target address bits 0:31 are taken to be the same as that of a search address. There may be some predicted branches having a target that does not have the same most significant bits as that of the search address. In such a case, the BTB cannot predict the correct target by simply using bits 0:31 of the search address as bits 0:31 of the predicted target address. Exemplary embodiments, as described in greater detail herein, assist in correctly predicting a branch target address where a predicted target address range of the predicted target address is different from the most significant (e.g., bits 0:31) address bits of the search address, thereby pointing to a different region of memory.

Figure 1:
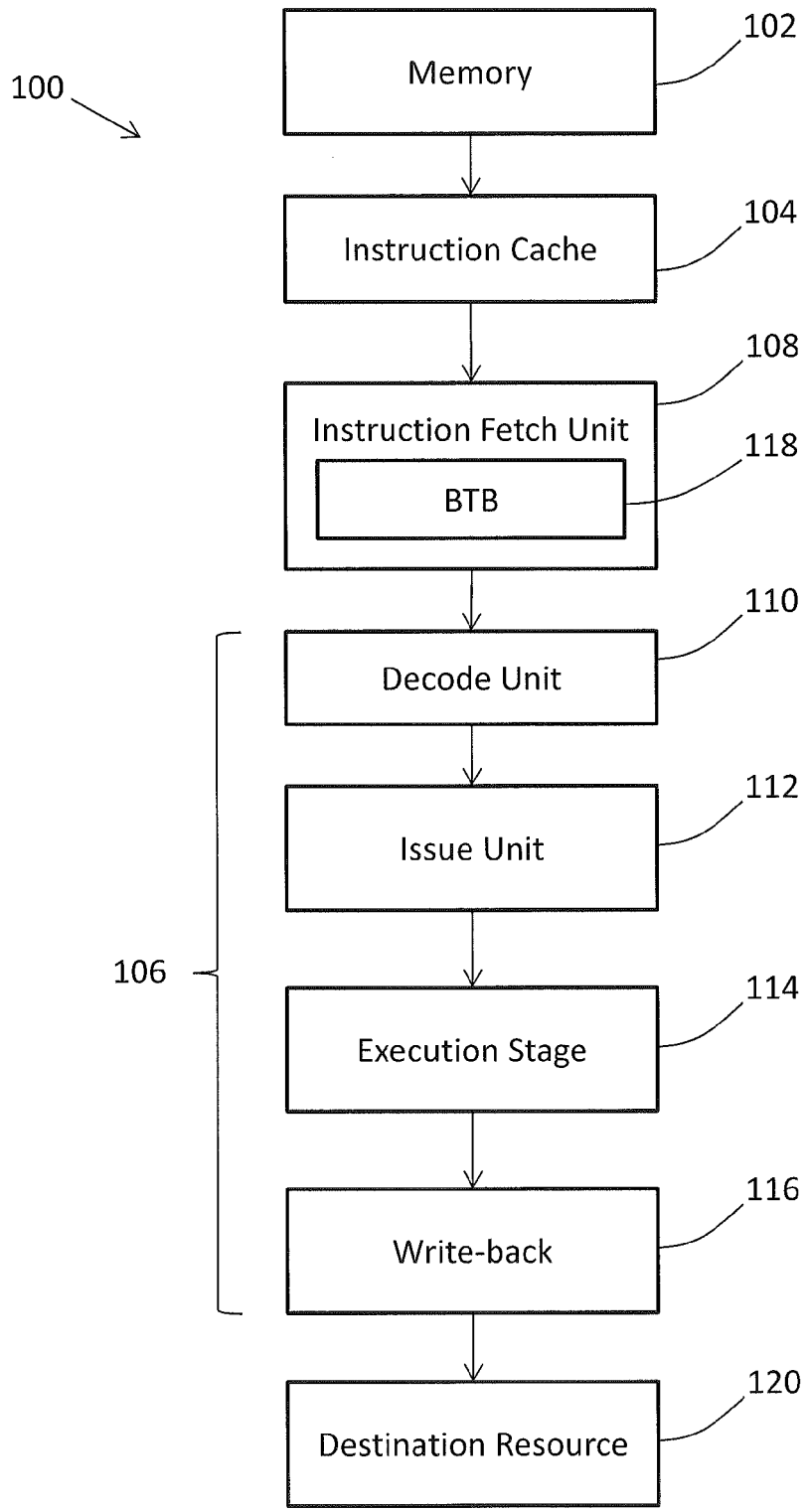
FIG. 1 depicts a processing system according to an embodiment.

FIG. 1 depicts a block diagram a processing system 100 according to an embodiment. The processing system 100 includes a memory 102, an instruction cache 104, an instruction fetch unit 108, and a processing pipeline 106. The processing system 100 may be included within a computer processor or otherwise distributed within a computer system. Instructions and data can be stored in memory 102, and the instruction cache 104 may access instructions in memory 102 and store the instructions to be fetched. The memory 102 may include any type of volatile or non-volatile memory, such as cache memory. The memory 102 and instruction cache 104 can include multiple cache levels. A data cache (not depicted) may also be included in the processing system 100.

In FIG. 1, a simplified example of the instruction fetch unit 108 and the processing pipeline 106 are depicted. The processing system 100 can further include multiple processing pipelines 106 and instruction fetch units 108. The processing pipeline 106 includes a decode unit 110, an issue unit 112, an execution stage 114, and write-back logic 116. The instruction fetch unit 108 may also be part of the processing pipeline 106. The processing pipeline 106 can include other features, such as error checking and handling logic, one or more parallel paths through the processing pipeline 106, and other features known in the art. While a forward path through the processing system 100 is depicted in FIG. 1, other feedback and signaling paths may be included between elements of the processing system 100.

The instruction fetch unit 108 fetches instructions from the instruction cache 104 for further processing by the decode unit 110. The instruction fetch unit 108 is an example of a processing circuit to implement target buffer address region tracking. In an exemplary embodiment, the instruction fetch unit 108 includes a BTB 118. Alternatively, the BTB 118 may be located separately from the instruction fetch unit 108. The instruction fetch unit 108 can also include other branch prediction logic (not depicted).

The decode unit 110 decodes instructions and passes the decoded instructions, portions of instructions, or other decoded data to the issue unit 112. The issue unit 112 analyzes the instructions or other data and transmits the decoded instructions, portions of instructions, or other data to one or more execution units in the execution stage 114 based on the analysis. The execution stage 114 executes the instructions. The execution stage 114 may include a plurality of execution units, such as fixed-point execution units, floating-point execution units, load/store execution units, and vector execution units. The write-back logic 116 writes results of instruction execution back to a destination resource 120. The destination resource 120 may be any type of resource, including registers, cache memory, other memory, I/O circuitry to communicate with other devices, other processing circuits, or any other type of destination for executed instructions or data.

Figure 2:
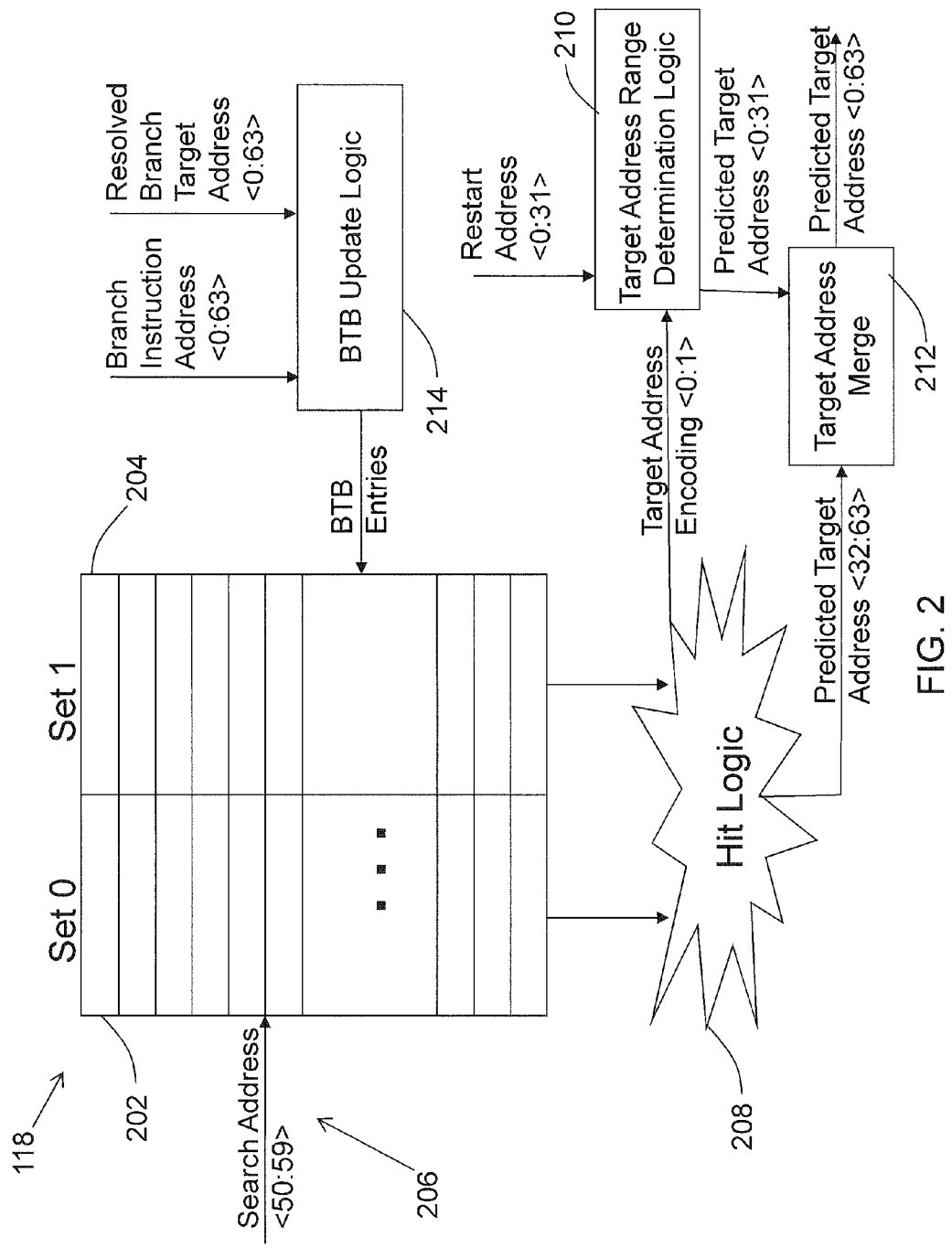
FIG. 2 depicts a branch target buffer according to an embodiment.
Figure 3:
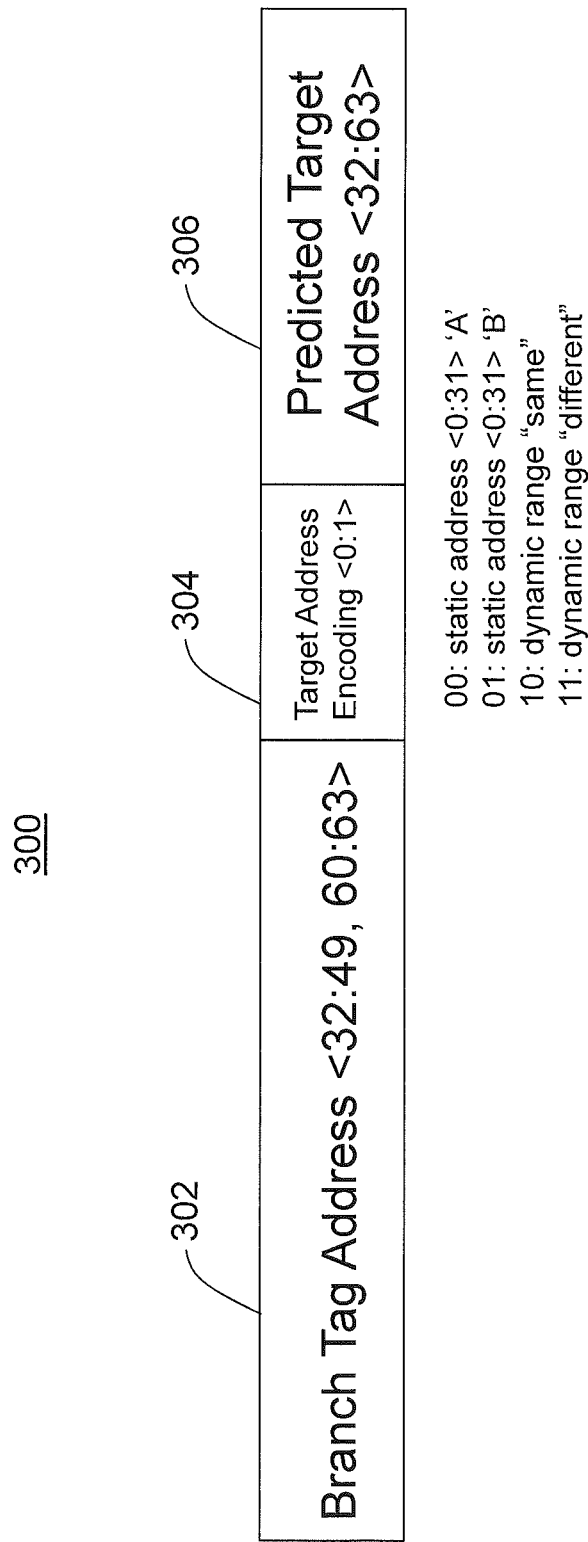
FIG. 3 depicts a branch target buffer entry according to an embodiment.

FIG. 2 depicts an example of the BTB 118 of FIG. 1 in greater detail. The example BTB 118 of FIG. 2 is set associative, including two sets, set zero and set one, of BTB entries 202 and 204. In an embodiment, an instruction fetch address used by the instruction fetch unit 108 of FIG. 1 is used as a search address to access the BTB 118 and predict a branch target address. In the example of FIG. 2, bits 50:59 of the search address are used as an index 206 into the BTB 118 to analyze BTB entries 202 and 204. A generic example of one of the BTB entries 202, 204 is depicted in FIG. 3 as BTB entry 300 (also referred to as entry 300), which includes a branch tag address 302 based on bits 32:49 and 60:63 of the search address, target address encoding 304 including two bits, and a portion of a predicted target address 306 including bits 32:63 of the predicted target address. When the target address encoding 304 includes two bits, two possible combinations can be reserved for static address values and two possible combinations can be reserved for dynamic address values. For example, '00' can map to a static address where predicted target address 0:31=0x0000 0000 (hexadecimal); '01' can map to predicted target address 0:31 =some other static address, which may be a configurable or hardwired value; '10' can map to predicted target address 0:31=branch instruction address 0:31 ["same range"]; and, '11' can map to predicted target address 0:31=a prior executed branch instruction address 0:31 which is not one of the defined static address ranges ["different range"]. More states may be added by expanding the number of bits in the target address encoding 304 to define additional static address ranges with two dynamic address ranges ("same range" and "different range").

Hit logic 208 in FIG. 2, can be used to determine whether a match or "hit" is located in the BTB 118 upon receiving a search address. In the example of FIG. 2, bits 50:59 of the search address are used as the index 206 into the BTB 118 and bits 32:49 and 60:63 of the search address can be compared to branch tag address values for the BTB entries 202 and 204. If a match is found, the hit logic 208 passes target address encoding 0:1 to target address range determination logic 210, which also receives restart address 0:31. A match need not be an exact match, but may be a closest match at or after the search address. The restart address 0:31 is a portion of an initial search address provided when the processing pipeline 106 of FIG. 1 restarts for events such as a branch wrong, a surprise taken branch, an operating system task swap, or other pipeline flush event. The target address range determination logic 210 determines a predicted target address 0:31, which is a predicted target address range. Predicted target address 32:63 is read from the BTB 118 as a portion of the predicted target address and passed by the hit logic 208 to target address merge 212, which combines the predicted target address 0:31 from the target address range determination logic 210 and predicted target address 32:63 to output as predicted target address 0:63.

BTB update logic 214 creates and populates the BTB 118 with BTB entries 202, 204. The BTB update logic 214 may update the BTB 118 at execution time from execution stage 114 or at a later time such as write-back time from write-back logic 116. The BTB update logic 214 may receive branch instruction address 0:63 and resolved branch target address 0:63. In exemplary embodiments, when populating the BTB 118, the BTB update logic 214 performs a check of resolved branch target address 0:31 to determine if the address matches one of the defined static addresses 0:31. Resolved branch target address 0:31 represents an address range of a resolved or calculated branch target address, i.e. an actual target address, while the predicted target address 0:63 represents a predicted target address. If a match is identified, then the BTB entry 300 stores an encoded version (e.g., 2 bits) of the resolved branch target address 0:31 using target address encoding 304. For example, if resolved branch target address 0:31 matches a first defined static address, then target address encoding 304 is set to '00', and if resolved branch target address 0:31 matches a second defined static address, then target address encoding 304 is set to '01'. If resolved branch target address 0:31 does not match a static range, but matches that of the branch instruction address 0:31, then target address encoding 304 is set to '10' ("same range") in this example. If resolved branch target address 0:31 does not match any of the given addresses then target address encoding 304 is set to '11' ("different range"). The branch tag address 302 is set to bits 32:49 and 60:63 of the branch instruction address, and bits 50:59 of the branch instruction address can be used as the index 206 into the BTB 118. The portion of a predicted target address 306 in BTB entry 300 is set to bits 32:63 of the resolved branch target address.

Figure 4:
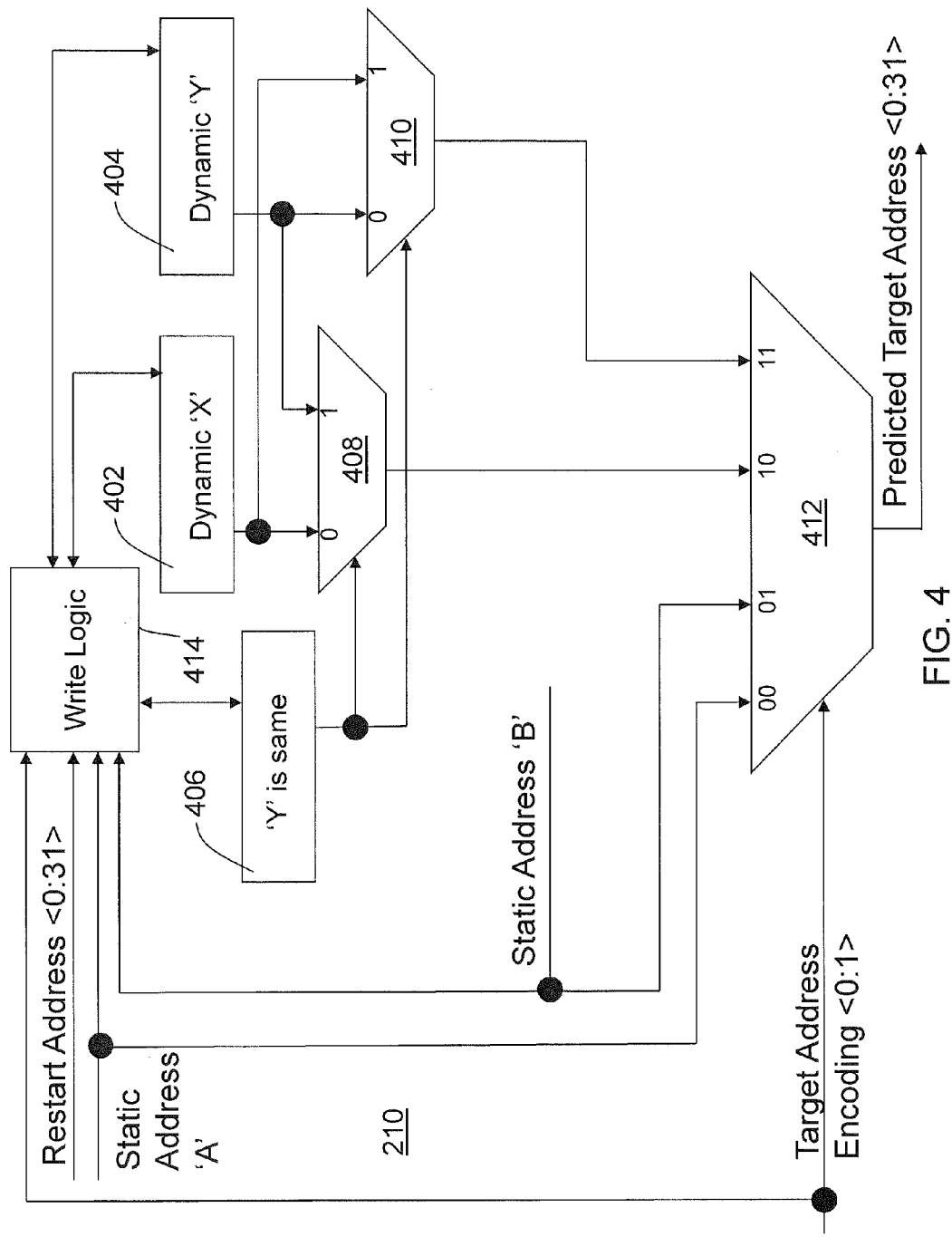
FIG. 4 depicts target address range determination logic according to an embodiment.

FIG. 4 depicts details of the target address range determination logic 210 of FIG. 2. The target address range determination logic 210 includes a first stored address 'X' 402, also referred to as dynamic 'X' holding a first dynamic address range, and a second stored address 'Y' 404, also referred to as dynamic 'Y' holding a second dynamic address range. A same value selector 406 is used to select whether the first stored address 'X' 402 represents a same range value and the second stored address 'Y' 404 represents a different range value, or vice versa. The first stored address 'X' 402, the second stored address 'Y' 404, and the same value selector 406 may be implemented in registers and updated by write logic 414. In the example of FIG. 4, both of the first stored address 'X' 402 and the second stored address 'Y' 404 are routed to multiplexers 408 and 410 to select which value represents the same range at multiplexer 412 input '10' and which value represents the different range at multiplexer 412 input '11'. The first stored address 'X' 402 may hold the last value of a restart address 0:31 (same range), and the second stored address 'Y' 404 may hold the previous unique value of the restart address 0:31 that was different than the first stored address 'X' 402 (different range). In this example, the same value selector 406 is set to zero to indicate that the first stored address 'X' 402 represents the same address range. When the same value selector 406 is zero, the first stored address 'X' 402 is selected by multiplexer 408 and routed to multiplexer 412 input '10'. Also, when the same value selector 406 is zero, the second stored address 'Y' 404 is selected by multiplexer 410 and routed to multiplexer 412 input '11'. Multiplexer 412 inputs '00' and '01' output first and second static address ranges as predicted target address 0:31. The multiplexer 412 selects an input as the predicted target address 0:31 based on the target address encoding 0:1 passed to the target address range determination logic 210.

The restart address 0:31 is a portion of an initial search address provided when the processing pipeline 106 of FIG. 1 restarts for events such as a branch wrong, a surprise taken branch, an operating system task swap, or other pipeline flush event. After receiving a restart address 0:31 that does not match the first stored address 'X' 402, or any other address, the new restart address 0:31 is stored in the second stored address 'Y' 404 which becomes the same range and the first stored address 'X' 402 becomes the different range. Accordingly, the same value selector 406 is set to one, such that multiplexer 408 selects the second stored address 'Y' 404 for multiplexer 412 input '10' and multiplexer 410 selects the first stored address 'X' 402 for multiplexer 412 input '11'.

The write logic 414 can also receive the target address encoding 0:1 and read the same value selector 406. In exemplary embodiments, on a predicted branch taken, when the target address encoding 0:1 indicates a first defined static address (e.g., '00'), a second defined static address (e.g., '01'), or a same range (e.g., '10'), the state of the same value selector 406 remains unchanged. Based on determining that the target address encoding 0:1 identifies a different range (e.g., '11'), identification of the same range and the different range is swapped by inverting the state of the same value selector 406. In other words, if the first stored address 'X' 402 was "same" (hence, the second stored address 'Y' 404 is "different") and the branch target is different, then on the next target prediction, if it is "same", now the second stored address 'Y' 404 is "same" and the first stored address 'X' 402 is "different".

Figure 5:
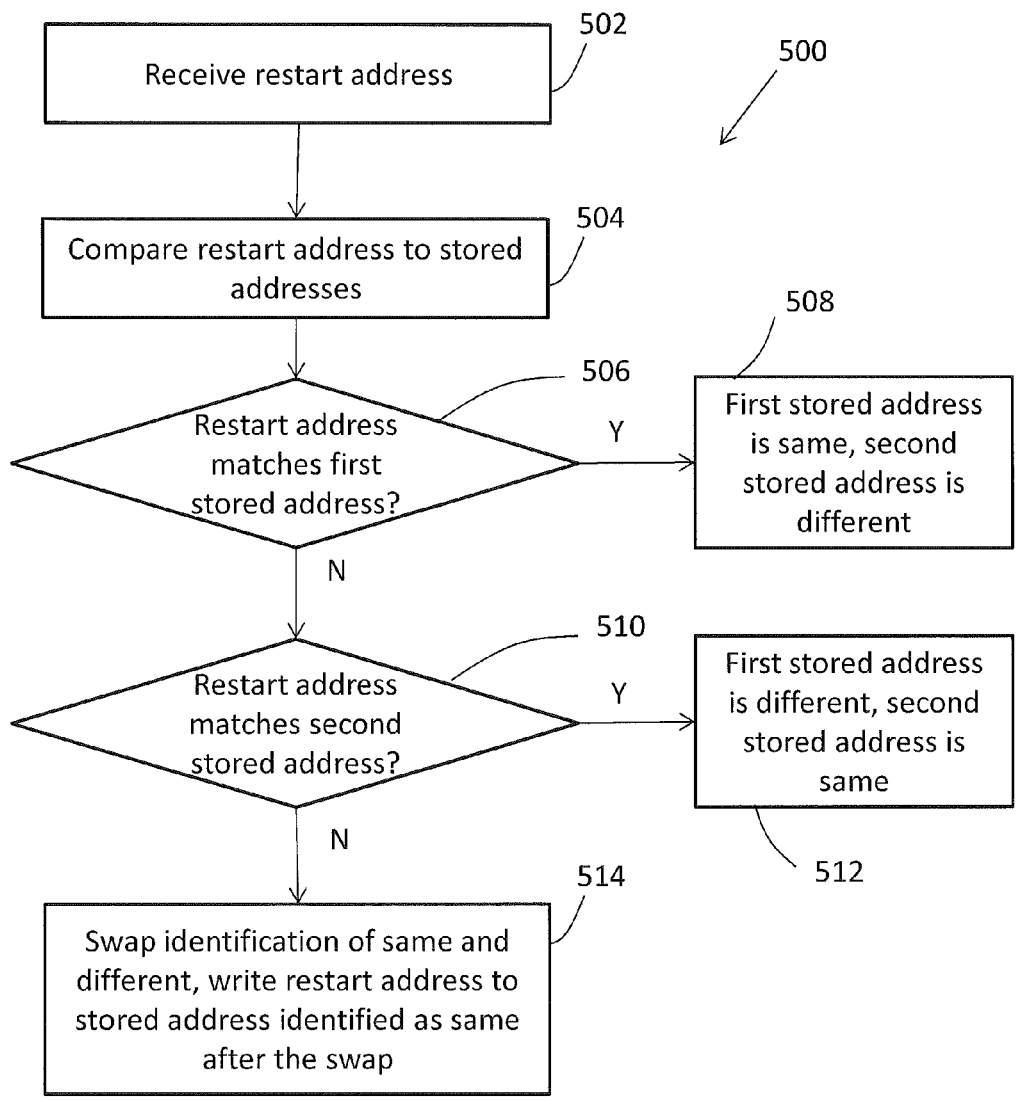
FIG. 5 is a flowchart illustrating a process of target buffer address region tracking according to an embodiment.

A process 500 that may be implemented by the write logic 414 of FIG. 4 is described in reference to FIG. 5. At block 502, whenever the processing pipeline 106 of FIG. 1 is started/restarted (for example, branch wrong, surprise taken branch, O/S task swap, other pipeline flush event), a restart address 0:31 is received. At block 504, dynamic address ranges saved in the first stored address 'X' 402 and the second stored address 'Y' 404 are compared to the restart address 0:31. At block 506, if the restart address 0:31 matches the first stored address 'X' 402, then the first stored address 'X' 402 is identified as the same range and the second stored address 'Y' 404 is identified as the different range at block 508. At block 510, if the restart address 0:31 matches the second stored address 'Y' 404, then the first stored address 'X' 402 is identified as the different range and the second stored address 'Y' 404 is identified as the same range at block 512.

If the restart address 0:31 matches neither the first stored address 'X' 402 nor the second stored address 'Y' 404, then identification of the same range and the different range is swapped at block 514. This may be performed by changing the state of the same value selector 406 to swap same and different designations of the first stored address 'X' 402 and the second stored address 'Y' 404. The restart address 0:31 is written to one of the first and second stored addresses 'X' 402 and 'Y' 404 identified as the same range after the swap. Therefore, the previously most recently referenced range (previously same range) is deemed the different range, and the new restart address range becomes the same range. Additionally, the write logic 414 of FIG. 4 may compare the restart address 0:31 to the static address ranges and based on determining that the restart address 0:31 matches one of the static address ranges, make no changes to the first and second stored addresses 'X' 402 and 'Y' 404 and identification of the same and different ranges.

Figure 6:
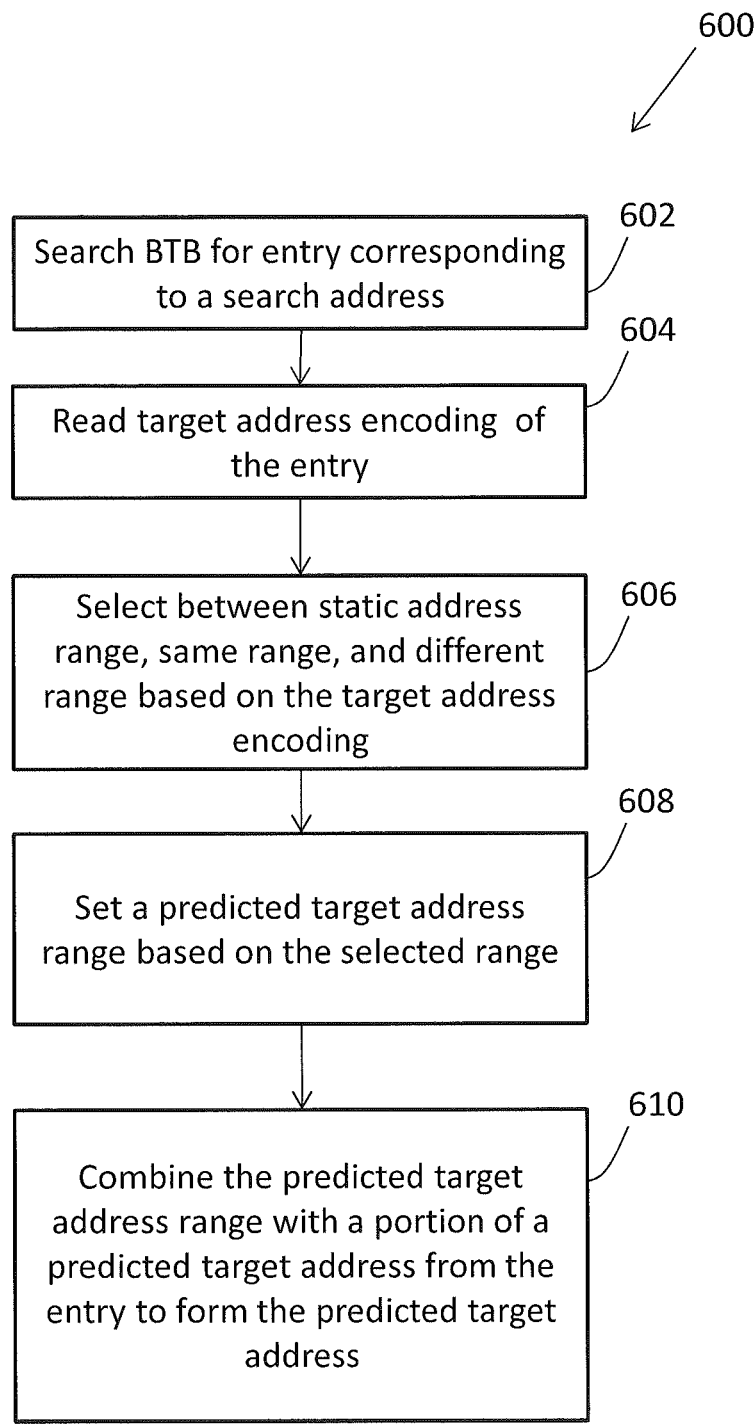
FIG. 6 is a flowchart illustrating a process of target buffer address region determination according to an embodiment.

Turning now to FIG. 6, a process 600 of branch target buffer address region determination will now be described in an exemplary embodiment. The process 600 is described in reference to FIGS. 1-4 and can be implemented by the BTB 118 of FIGS. 1 and 2. The process 600 may be applied to not just the BTB 118 but to any prediction structure which predicts an address. Accordingly, the BTB 118 may be referred to generally as a target buffer, the search address can be an address of another type of instruction other than a branch instruction, and the predicted target address can represent a predicted address other than a predicted address targeted by a branch instruction.

At block 602, the BTB 118 is searched for an entry 300 corresponding to a search address, where a portion of the search address is used as the index 206 into the BTB 118. The BTB 118 may be searched based on an instruction fetch address of the instruction fetch unit 108 of FIG. 1. At block 604, upon locating the entry 300 corresponding to the search address, a target address encoding 304 of the entry 300 is read, which may be performed as part of hit logic 208 of FIG. 2.

At block 606, target address range determination logic 210 of FIGS. 2 and 4 selects between a static address range, the same range, and the different range is performed based on the target address encoding 304 of the entry 300. The selection may be performed relative to multiple static address ranges. In the example of FIG. 3, target address encoding 304 identifies a first static address range, a second static address range, the same range, and the different range as '00', '01', '10' and '11' respectively, which can be used to select inputs at multiplexer 412 of FIG. 4. In an embodiment, the first static address range, the second static address range, the same range, and the different range each define different regions of memory.

At block 608, a predicted target address range is set based on the selected range. The target address range determination logic 210 of FIGS. 2 and 4 can set the predicted target address 0:31 as the predicted target address range. Based on determining that the target address encoding 304 identifies the first static address range, the predicted target address range is set to the first static address range. Based on determining that the target address encoding 304 identifies the second static address range, the predicted target address range is set to the second static address range. Based on determining that the target address encoding 304 identifies the same range, the predicted target address range is set to the same range. Based on determining that the target address encoding 304 identifies the different range, the predicted target address range is set to the different range.

At block 610, the predicted target address range, defined as predicted target address 0:31, is combined with the portion (e.g., bits 32:63) of the predicted target address 306 from the entry 300 to form the predicted target address 0:63 at target address merge 212 of FIG. 2.

Figure 7:
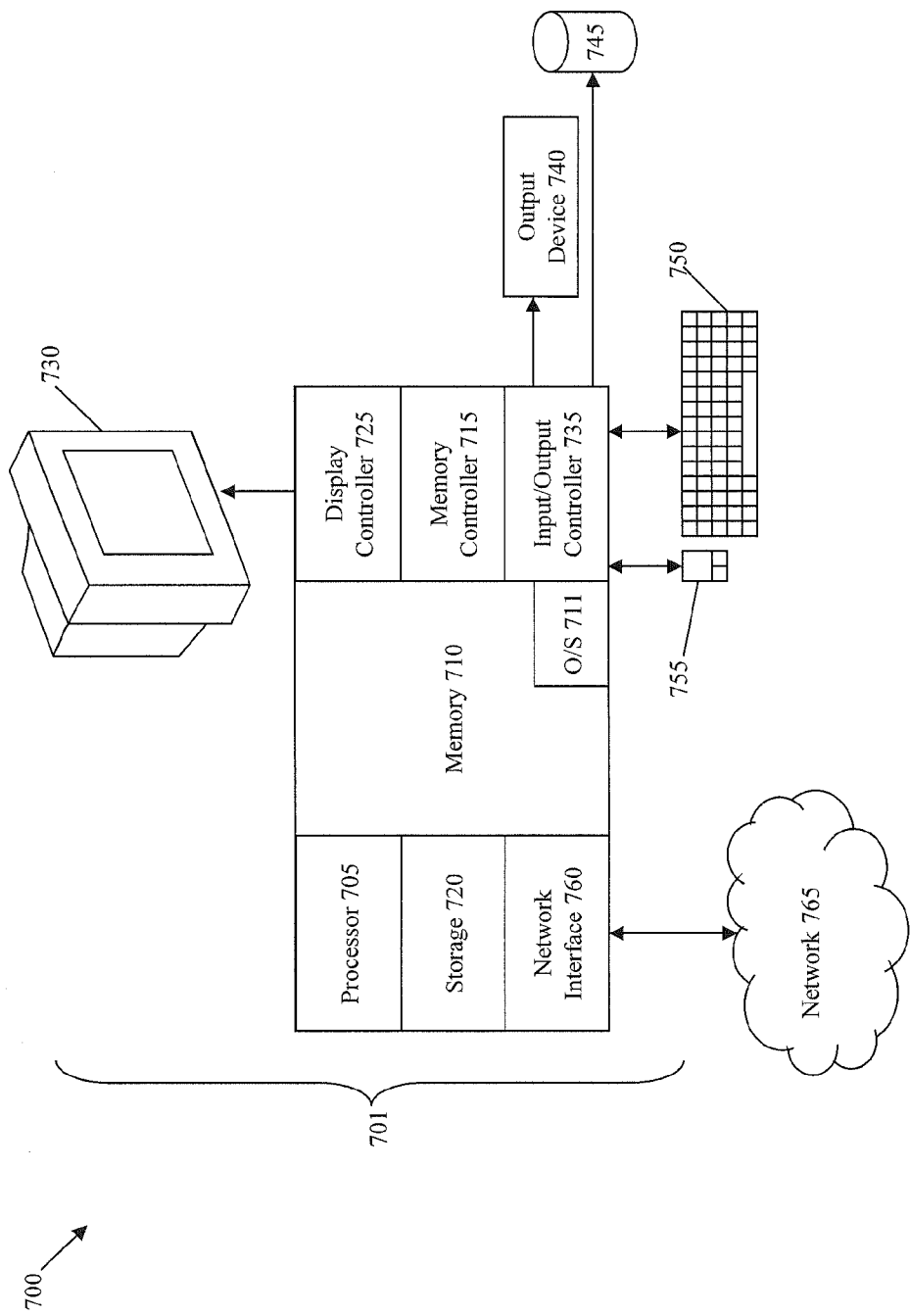
FIG. 7 depicts a computing system according to an embodiment.

FIG. 7 depicts a block diagram of a system 700 for target buffer address region tracking in a processor 705. The methods described herein can be implemented in hardware, software (e.g., firmware), or a combination thereof. In an exemplary embodiment, the methods described herein are implemented in hardware as part of the microprocessor of a special or general-purpose digital computer, such as a personal computer, workstation, minicomputer, or mainframe computer. The system 700 therefore includes general-purpose computer 701 as illustrated in FIG. 7.

In an exemplary embodiment, in terms of hardware architecture, as shown in FIG. 7, the computer 701 includes a processor 705 which is a processing circuit that includes the processing pipeline 106 of FIG. 1 and a BTB 118. The computer 701 further includes memory 710 coupled to a memory controller 715, and one or more input and/or output (I/O) devices 740, 745 (or peripherals) that are communicatively coupled via a local input/output controller 735. The input/output controller 735 can be, for example but not limited to, one or more buses or other wired or wireless connections, as is known in the art. The input/output controller 735 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 705 is a hardware device for executing software, particularly that stored in storage 720, such as cache storage, or memory 710. The processor 705 can be any custom made or commercially available processor, a central processing unit (CPU), an auxiliary processor among several processors associated with the computer 701, a semiconductor based microprocessor (in the form of a microchip or chip set), a macroprocessor, or generally any device for executing instructions.

The memory 710 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 710 may incorporate electronic, magnetic, optical, and/or other types of storage media. Note that the memory 710 can have a distributed architecture, where various components are situated remote from one another, but can be accessed by the processor 705.

The instructions in memory 710 may include one or more separate programs, each of which comprises an ordered listing of executable instructions for implementing logical functions. In the example of FIG. 7, the instructions in the memory 710 a suitable operating system (OS) 711. The operating system 711 essentially controls the execution of other computer programs and provides scheduling, input-output control, file and data management, memory management, and communication control and related services.

In an exemplary embodiment, a conventional keyboard 750 and mouse 755 can be coupled to the input/output controller 735. Other output devices such as the I/O devices 740, 745 may include input devices, for example but not limited to a printer, a scanner, microphone, and the like. Finally, the I/O devices 740, 745 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 700 can further include a display controller 725 coupled to a display 730. In an exemplary embodiment, the system 700 can further include a network interface 760 for coupling to a network 765. The network 765 can be an IP-based network for communication between the computer 701 and any external server, client and the like via a broadband connection. The network 765 transmits and receives data between the computer 701 and external systems. In an exemplary embodiment, network 765 can be a managed IP network administered by a service provider. The network 765 may be implemented in a wireless fashion, e.g., using wireless protocols and technologies, such as WiFi, WiMax, etc. The network 765 can also be a packet-switched network such as a local area network, wide area network, metropolitan area network, Internet network, or other similar type of network environment. The network 765 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 701 is a PC, workstation, intelligent device or the like, the instructions in the memory 710 may further include a basic input output system (BIOS) (omitted for simplicity). The BIOS is a set of essential software routines that initialize and test hardware at startup, start the OS 711, and support the transfer of data among the hardware devices. The BIOS is stored in ROM so that the BIOS can be executed when the computer 701 is activated.

When the computer 701 is in operation, the processor 705 is configured to fetch and execute instructions stored within the memory 710, to communicate data to and from the memory 710, and to generally control operations of the computer 701 pursuant to the instructions.

In an exemplary embodiment, where the BTB 118 of FIG. 2 is implemented in hardware, the methods described herein, such as processes 500 and 600 of FIGS. 5 and 6, can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

As will be appreciated by one skilled in the art, one or more aspects of the present invention may be embodied as a system, method or computer program product. Accordingly, one or more aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 8:
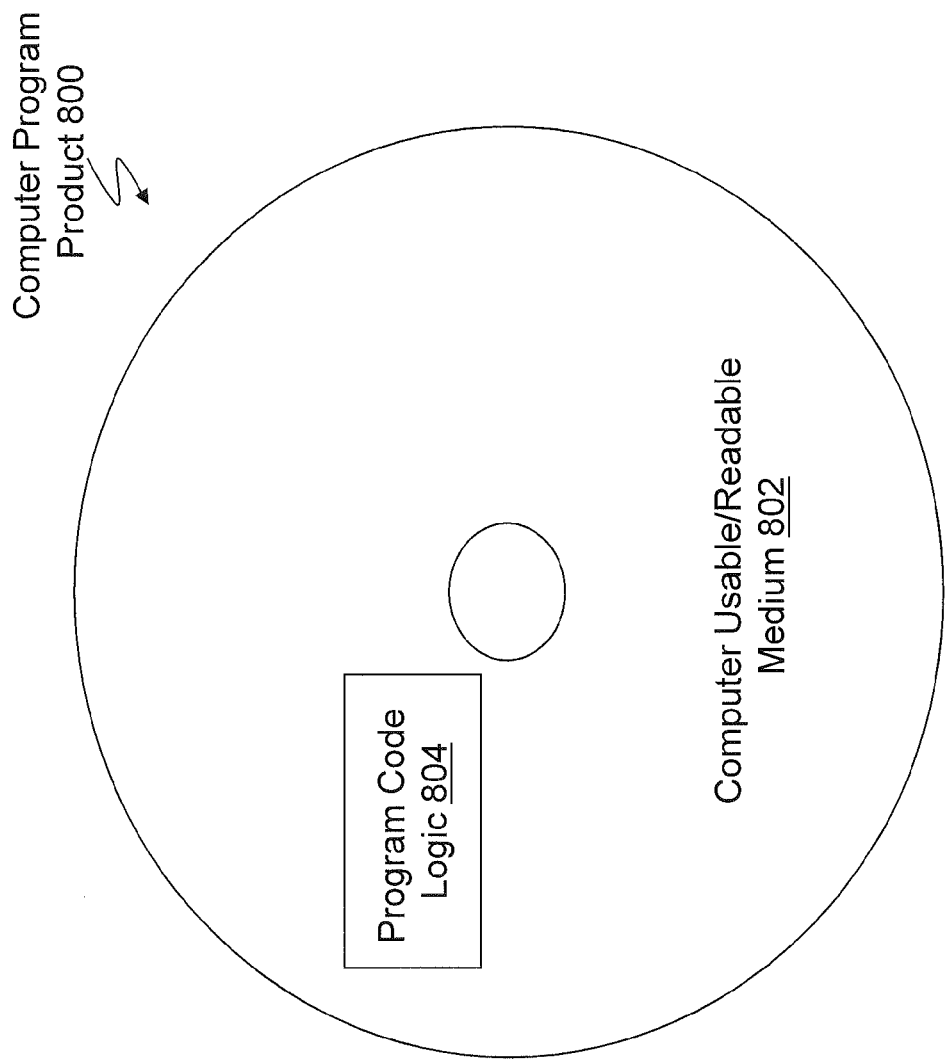
FIG. 8 depicts a computer-readable medium according to an embodiment.

Referring now to FIG. 8, in one example, a computer program product 800 includes, for instance, one or more storage media 802, wherein the media may be tangible and/or non-transitory, to store computer readable program code means or logic 804 thereon to provide and facilitate one or more aspects of embodiments described herein.

Program code, when created and stored on a tangible medium (including but not limited to electronic memory modules (RAM), flash memory, Compact Discs (CDs), DVDs, Magnetic Tape and the like is often referred to as a "computer program product". The computer program product medium is typically readable by a processing circuit preferably in a computer system for execution by the processing circuit. Such program code may be created using a compiler or assembler for example, to assemble instructions, that, when executed perform aspects of the invention.

Technical effects and benefits include target buffer address region tracking. Multiple static and dynamic address ranges defining different regions of memory can be selected using target address encoding in a branch target buffer. Dynamic tracking of same and different address ranges of branch instructions can improve accuracy of branch target predictions as address ranges change or cycle between different ranges.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments have been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles and the practical application, and to enable others of ordinary skill in the art to understand the embodiments with various modifications as are suited to the particular use contemplated.

Computer program code for carrying out operations for aspects of the embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments are described above with reference to flowchart illustrations and/or schematic diagrams of methods, apparatus (systems) and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A system for target buffer address region tracking, the system comprising:
    memory configured to store instructions accessible by a processor; and
    the processor comprising a target buffer, wherein the processor is configured to perform a method comprising:
        receiving a restart address comprising a portion of an initial search address;
        comparing the restart address to a first stored address and to a second stored address, the first stored address and the second stored address each comprising a number of bits defining an address range;
        determining which one of the first and second stored addresses is identified as a same range and which one of the first and second stored addresses is identified as a different range based on a same value selector to form a predicted target address range defining an address region associated with an entry in the target buffer;
        based on determining that the restart address matches the first stored address, identifying the first stored address as the same range and the second stored address as the different range;
        based on determining that the restart address matches the second stored address, identifying the first stored address as the different range and the second stored address as the same range; and
        based on determining that the restart address matches neither the first stored address nor the second stored address, swapping identification of the same range and the different range by changing a state of the same value selector, and writing the restart address to one of the first and second stored addresses identified as the same range after the swapping.

2. The system of claim 1, wherein the processor is configured to perform:
    comparing the restart address to a static address range; and
    based on determining that the restart address matches the static address range, making no changes to the first and second stored addresses and identification of the same and different ranges.

3. The system of claim 1, wherein the receiving of the restart address is based on a processing pipeline restart of the processor.

4. The system of claim 1, wherein the processor is configured to perform:
    receiving a branch instruction address and a resolved branch target address;
    creating a new entry in the target buffer based on receiving the branch instruction address and the resolved branch target address;
    setting a target address encoding of the new entry to identify a first static address range based on determining that an address range of the resolved branch target address matches the first static address range;
    setting the target address encoding of the new entry to identify a second static address range based on determining that the address range of the resolved branch target address matches the second static address range;
    setting the target address encoding of the new entry to identify the same range based on determining that the address range of the resolved branch target address does not match either of the first or second static address ranges and does match an address range of the branch instruction address; and
    setting the target address encoding of the new entry to identify the different range based on determining that the address range of the resolved branch target address does not match the first static address range, the second static address range, and the address range of the branch instruction address.

5. The system of claim 1, wherein the processor is configured to perform:

searching the target buffer for an entry corresponding to a search address;

reading a target address encoding of the entry corresponding to the search address;

selecting between a static address range, the same range, and the different range based on the target address encoding of the entry;

based on determining that the target address encoding identifies the static address range, setting the predicted target address range to the static address range;

based on determining that the target address encoding identifies the same range, setting the predicted target address range to the same range; and based on determining that the target address encoding identifies the different range, setting the predicted target address range to the different range.

6. The system of claim 5, wherein the processor is configured to perform:

based on determining that the target address encoding identifies the different range, swapping identification of the same range and the different range.

7. The system of claim 5, wherein the processor is configured to perform:

reading a portion of a predicted target address from the entry corresponding to the search address; and combining the predicted target address range with the portion of the predicted target address to form the predicted target address.

8. The system of claim 7, wherein the target buffer is a branch target buffer, the search address is for that of an address of a branch instruction, and the predicted target address is a predicted address targeted by the branch instruction.

* * * * *